United States Patent
Norato et al.

(10) Patent No.: US 10,114,913 B2
(45) Date of Patent: Oct. 30, 2018

(54) METHOD AND SYSTEM FOR DETERMINING WELDING SEQUENCES

(71) Applicant: Caterpillar Inc., Peoria, IL (US)

(72) Inventors: Julian Andres Norato, Urbana, IL (US); Sungmoon Jung, Tallahassee, FL (US); Badrinarayan Parthasarathy Athreya, Edwards, IL (US); Christopher Ha, Champaign, IL (US)

(73) Assignee: Caterpillar Inc., Deerfield, IL (US)

( * ) Notice: Subject to any disclaimer, the term of this patent is extended or adjusted under 35 U.S.C. 154(b) by 525 days.

(21) Appl. No.: 14/749,775

(22) Filed: Jun. 25, 2015

(65) Prior Publication Data
US 2015/0294051 A1 Oct. 15, 2015

Related U.S. Application Data

(62) Division of application No. 13/166,181, filed on Jun. 22, 2011.

(51) Int. Cl.
*B23K 9/10* (2006.01)
*G06F 17/50* (2006.01)
(Continued)

(52) U.S. Cl.
CPC .......... *G06F 17/5009* (2013.01); *B23K 31/02* (2013.01); *B23K 31/12* (2013.01); *G06Q 10/04* (2013.01)

(58) Field of Classification Search
CPC ............................. B23K 9/095; B23K 9/0953
(Continued)

(56) References Cited

U.S. PATENT DOCUMENTS

| 3,635,390 A * | 1/1972 | Gross | G05B 19/07 228/4.1 |
| 4,095,077 A * | 6/1978 | Schneider | B23K 9/10 219/61 |

(Continued)

FOREIGN PATENT DOCUMENTS

| JP | 11-250118 A | 9/1999 |
| JP | 2001-273022 | 10/2001 |
| JP | 3698007 B2 | 9/2005 |

OTHER PUBLICATIONS

Fukuda, Shuichi et al., "Determination of Welding Sequence: A Neural Net Approach," *Engineering Analysis with Boundary Elements*, vol. 7, No. 2, 1990, pp. 78-82.

(Continued)

*Primary Examiner* — Dana Ross
*Assistant Examiner* — Ayub Maye
(74) *Attorney, Agent, or Firm* — Finnegan, Henderson, Farabow, Garrett & Dunner, LLP

(57) ABSTRACT

A system for determining a welding sequence is disclosed. The system may have a welding sequence generator configured to create an initial population of welding sequences based on a user-generated constraint. The system may also have a welding simulator configured to simulate welding for at least one welding sequence in the initial population of welding sequences to model distortion for the at least one welding sequence. The welding sequence generator may be further configured to receive the distortion for the at least one welding sequence in the initial population from the welding simulator, determine whether a merit value derived from at least the distortion for the at least one welding sequence satisfies one or more predetermined criteria, output (Continued)

the at least one welding sequence as a potential welding sequence if the merit value satisfies the predetermined criteria.

7 Claims, 3 Drawing Sheets

(51) Int. Cl.
*B23K 31/02* (2006.01)
*B23K 31/12* (2006.01)
*G06Q 10/04* (2012.01)

(58) Field of Classification Search
USPC .............. 219/130.1, 130.01, 125.1, 125.11
See application file for complete search history.

(56) References Cited

U.S. PATENT DOCUMENTS

| | | | |
|---|---|---|---|
| 4,224,501 A | 9/1980 | Lindbom et al. | |
| 4,459,457 A | 7/1984 | Jurek | |
| 4,998,050 A | 3/1991 | Nishiyama et al. | |
| 5,833,127 A * | 11/1998 | Powell | B23K 20/12 156/73.5 |
| 6,789,051 B1 | 9/2004 | Chen et al. | |
| 7,617,017 B2 * | 11/2009 | Menassa | G05B 19/41865 219/78.01 |
| 7,840,295 B2 | 11/2010 | Thibaud | |
| 8,692,157 B2 * | 4/2014 | Daniel | B23K 10/006 219/125.1 |
| 9,851,704 B2 * | 12/2017 | Spisic | G05B 15/02 |
| 2005/0004709 A1 * | 1/2005 | Watanabe | B25J 9/1664 700/245 |
| 2007/0043622 A1 | 2/2007 | Olsen et al. | |
| 2009/0164202 A1 * | 6/2009 | Lonnemark | G06F 8/52 703/22 |

OTHER PUBLICATIONS

Kadivar, M.H. et al., "Optimizing Welding Sequence with Genetic Algorithm," *Computational Mechanics*, vol. 26, 2000, pp. 514-519.

Voutchkov, I. et al., "Weld Sequence Optimization: The Use of Surrogate Models for Solving Sequential Combinatorial Problems." *Computational Methods in Applied Mechanics and Engineering*, vol. 194, 2005, pp. 3535-3551.

* cited by examiner

METHOD AND SYSTEM FOR DETERMINING WELDING SEQUENCES

RELATED APPLICATION

This is a division of U.S. patent application Ser. No. 13/166,181, filed Jun. 22, 2011, the subject matter of which is expressly incorporated herein by reference.

TECHNICAL FIELD

The present disclosure relates generally to welding methods, and more particularly, to a method for determining a sequence in which to welding operations are to be performed on an assembly.

BACKGROUND

Welding may be used in a variety of manufacturing applications, e.g., fabricating components of a mechanical structure, joining existing components to one another, etc. When a component of a mechanical structure is welded, thermal growth at the weld joint may mechanically distort the parts being joined. Excessive mechanical distortion in a welded component may make it difficult or impossible to assemble the component into the mechanical structure, may have a negative impact on its performance or function, and/or may require additional measures such as post-weld machining to repair the component.

In components with multiple weld joints, the amount of mechanical distortion may depend on the sequence in which the welding operations are performed. For example, mechanical distortion may be reduced by performing the different welding operations in a sequence that balances the forces of distortion. However, determining a welding sequence that generates acceptable amounts of mechanical distortion may be difficult because a component may include several weld joints (and thus a large number of combinatorial sequencing possibilities), the distortion effects may be non-linear and thus hard to predict, and the simulation to predict the distortion may be computationally intensive.

M. H. Kadivar et al., *Optimizing Welding Sequence With Genetic Algorithm*, 26 Computational Mechanics 514, 514-519 (2000) ("Kadivar") discloses a genetic algorithm used with a thermomechanical model to determine an optimum welding sequence. The genetic algorithm disclosed in Kadivar chooses sequences designed to minimize distortion and uses a maximum radial displacement parameter as its objective function. The thermomechanical model predicts residual stress and distortion for different populations in the genetic algorithm.

While the genetic algorithm and thermomechanical model disclosed in Kadivar may be used to minimize distortion, it may be computationally intensive in some applications and it does not take other factors into account in the objective function. For example, Kadivar does not incorporate user-generated sequencing constraints, e.g., subsequence constraints, contiguous constraints, rollover constraints, etc., into the genetic algorithm. Instead, by choosing from among all possible sequences, the system in Kadivar may generate unnecessary sequences to apply to the thermomechanical model, thus wasting resources. Further, considering only maximum radial distortion as an objective function limits the applicability of the system in Kadivar.

The disclosed system is directed to overcoming one or more of the problems set forth above and/or other problems of the prior art.

SUMMARY

In one aspect, the present disclosure is directed to a computer-implemented method for determining a welding sequence including a plurality of welding operations. The method may include creating an initial population of welding sequences based on at least one user-generated constraint; and simulating welding for at least one welding sequence in the initial population of welding sequences to model distortion for the at least one welding sequence. The method may also include determining whether a merit value derived from at least the distortion for the at least one welding sequence satisfies one or more predetermined criteria; and outputting the at least one welding sequence as a potential welding sequence if the merit value satisfies the predetermined criteria.

In another aspect, the present disclosure is directed to a system for determining a welding sequence including a plurality of welding operations. The system may include a welding sequence generator configured to create an initial population of welding sequences based on at least one user-generated constraint. The system may also include a welding simulator configured to simulate welding for at least one welding sequence in the initial population to model distortion for the at least one welding sequence. The welding sequence generator may be further configured to receive the distortion for the at least one welding sequence in the initial population from the welding simulator; determine whether a merit value derived from at least the distortion for the at least one welding sequence satisfies one or more predetermined criteria; and output the at least one welding sequence as a potential welding sequence if the merit value satisfies the predetermined criteria.

In yet another aspect, the present disclosure is directed to a computer-readable storage device storing instructions for determining a welding sequence including a plurality of welding operations. The instructions may cause one or more computer processors to create an initial population of welding sequences based on at least one user-generated constraint; and receive a distortion estimate for at least one welding sequence in the initial population of welding sequences. The instructions may further cause one or more computer processors to determine whether a merit value derived from at least the distortion estimate for the at least one welding sequence satisfies one or more predetermined criteria; and output the at least one welding sequence as a potential welding sequence if the merit value satisfies the predetermined criteria.

DETAILED DESCRIPTION

Figure 1:
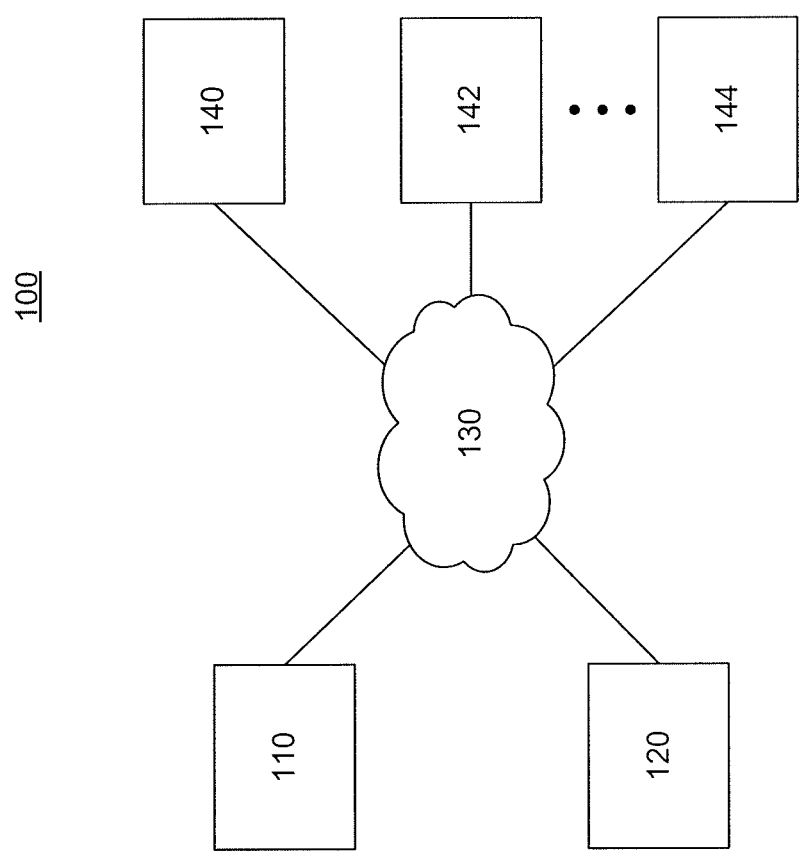
FIG. 1 is a diagrammatic illustration of an exemplary disclosed system for determining welding sequences.

FIG. 1 illustrates an exemplary system 100 that may be used to determine a sequence in which welding operations are to be performed on a welded assembly (i.e. a welding sequence). System 100 may include a welding sequence generator 110, a controller 120, and welding simulators 140, 142, and 144 connected by a network 130. Welding sequence generator 110 may generate a population of possible welding sequences using a genetic algorithm, and may send the population of possible welding sequences to controller 120 via network 130. Controller 120 may generate input files for each possible welding sequence in the population and may send the input files to one or more of welding simulators 140, 142, and/or 144 via network 130. Welding simulators 140, 142 and/or 144 may use the input files to simulate welding and determine one or more effects of each welding sequence, e.g., mechanical distortion of the assembly to be welded, time to complete welding, number of times the assembly must be rolled over to complete welding, etc. Data related to one or more of the effects of the possible welding sequences may be fed back to welding sequence generator 110 via network 130. Welding sequence generator 110 may generate subsequent populations of possible welding sequences based on the data and the genetic algorithm. In some embodiments welding sequence generator 110 may generate populations of possible welding sequences until a welding sequence that optimizes one or more of the welding effects is generated or until a predetermined number of populations have been generated.

System 100 may be used to determine a welding sequence for any type of assembly to be welded. For example, certain assemblies may require ten welding operations, numbered, e.g., 1-10. For example, one welding sequence for the assembly may be 1-2-3-4-5-6-7-8-9-10, while another welding sequence may be 2-1-4-3-6-5-8-7-10-9. In fact, for an assembly with ten welding operations, 10! (or 3,628,800) different possible welding sequences may exist. Each of these welding sequences may have different effects on the assembly, e.g., distortion, weld time, rollover requirements, etc. System 100 may determine an optimal and/or acceptable welding sequence from among all possible welding sequences without requiring welding simulators 140, 142, and/or 144 to simulate the welding effects for each sequence in the set of possible permutations. The components of system 100 and their interactions with each other are discussed in greater detail below.

Figure 3:
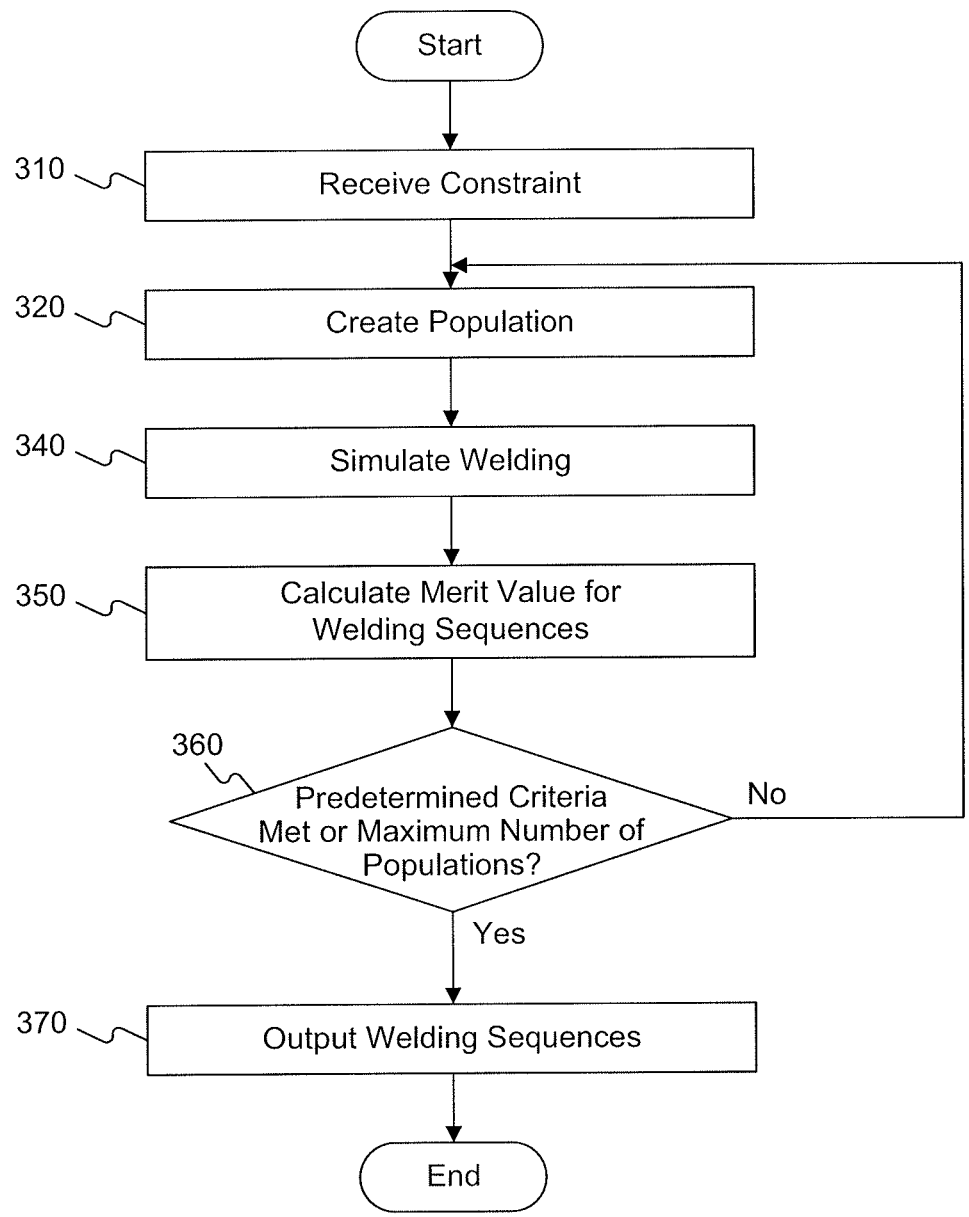
FIG. 3 is a flow chart illustrating an exemplary disclosed method of operating the system of FIG. 1.

Welding sequence generator 110 may include any device capable of generating possible welding sequences. In certain embodiments, welding sequence generator 110 may be embodied by a computer or other device that may include a processor, a memory, and a storage (not shown). The memory may include one or more programs loaded from the storage or elsewhere that, when executed by the processor, enable welding sequence generator 110 to perform various procedures, operations, or processes consistent with disclosed embodiments, including the processes described with regard to FIG. 3. The storage may store information and data that may be used by welding sequence generator 110 to generate welding sequences and evaluate the data related to the effects of the welding sequences. For example, the storage may store information and data related to a genetic algorithm, e.g., rules for generating welding sequences, one or more objective functions, etc.

Welding sequence generator 110 may also include one or more input/output devices that enable welding sequence generator 110 to communicate with other devices and/or operators. In certain embodiments, welding sequence generator 110 may include an input device that enables welding sequence generator 110 to receive user-generated constraints for generating populations of welding sequences. Welding sequence generator 110 may use the user-generated constraints to generate an initial population and subsequent populations of welding sequences that satisfy the user-generated constraints. For example, a population of sequences for an assembly with ten welding operations may include any small set (e.g., 20) of sequences out of the 3,628,800 possible welding sequences if no constraint is specified by the user, or out of the 1,814,400 possible sequences if, e.g., a user-generated constraint exists that requires a given weld to be performed before another given weld, for example. Examples of user-generated constraints are discussed below.

In one embodiment, welding sequence generator 110 may receive a user-generated subsequence constraint that restricts the relative order in which one or more of the welding operations in the welding sequence must be performed. For example, certain multi-pass welds may require that one welding operation is performed before another welding operation. Thus, a subsequence constraint may require that welding operation 7 be performed before welding operation 2. Accordingly, any possible welding sequence in the initial population or in the subsequent populations that includes welding operation 2 before welding operation 7 will be eliminated from the population. For example, 1-7-5-4-3-2-8-9-10-6 may be included in the population, but 1-5-4-2-8-7-9-10-3-6 may be eliminated from the population.

In another embodiment, welding sequence generator 110 may receive a user-generated contiguous constraint that requires one or more of the welding operations to be in a contiguous sequence. For example, a contiguous constraint may require that any possible welding sequence include the sequence 5-4-3. Thus, 10-9-8-7-6-5-4-3-2-1 may be included in the limited population, while 10-9-8-7-5-6-4-3-2-1 may be eliminated from the limited population.

In yet another embodiment, welding sequence generator 110 may receive a user-generated rollover constraint that restricts the number of times an assembly to be welded may be rolled over. For example, some welding operations may be performed on different sides of an assembly, and/or may otherwise require rotating or flipping the assembly. Because rotating or flipping the assembly may require additional cooling time between welding operations, multiple rollovers may increase the overall time it takes to weld an assembly and/or may have additional distortion effects. If welding sequence generator 110 receives a user-generated rollover constraint restricting the number of rollovers to one, then welding sequence generator 110 may limit the population to only welding sequences that require one rollover.

The user-generated constraints discussed above are merely examples and any type of user-generated constraint may be used to create the initial population and/or subsequent populations of welding sequences. For example, other user-generated constraints may include requiring a particular welding sequence to be performed first, requiring a particular welding sequence to be performed last, designating different rollover requirements along two or more axes of the assembly, etc.

Welding sequence generator 110 may also include an input for receiving user-generated objective functions (e.g., fitness functions) for the genetic algorithm that may be stored in the storage. For example, the genetic algorithm may include one or more objective functions against which one or more of the welding sequences in each population are measured. The objective functions may include variables related to the effects that the welding sequences may have on the assembly, e.g., distortion, weld time, rollover requirements, etc. Exemplary objective functions may include a maximum mechanical distortion of the assembly across all points, an average mechanical distortion across one or more points, a weighted sum of mechanical distortion across one or more points, any other type of scalar function, etc. Exemplary objective functions may also take into account effects other than distortion. For example, the objective function may include a number of rollovers, a total welding time, etc. Exemplary objective functions may also take into account multiple different effects. For example, the objective function may include a weighted sum or other calculation of distortion across one or more points, the number of rollovers and/or total welding time. Objective functions are discussed in greater detail below with regard to FIG. 2.

Welding sequence generator 110 may also include an input for receiving other user-generated inputs related to the genetic algorithm. For example, welding sequence generator 110 may receive and store in the storage a user-generated input that limits the number of welding sequences in each population and/or that limits the number of subsequent populations that welding sequence generator 110 may generate. Similarly, welding sequence generator 110 may receive a user-generated input that controls one or more parameters of the genetic algorithm used to generate the welding sequences. For example, a user-generated input may determine the probability of crossover and/or mutation among welding operations in one or more welding sequences used to generate a subsequent population. Further, welding sequence generator 110 may also receive a user-generated input that designates particular welding sequences used to form the first population of welding sequences (seeding sequences). In another embodiment, the seeding sequences may be generated randomly by welding sequence generator 110.

Welding sequence generator 110 may also include an output for outputting potential welding sequences to a user, e.g., by a device such as a display device. For example, as discussed in greater detail below with regard to FIG. 2, welding sequence generator 110 may measure welding sequences against one or more objective functions in order to determine the relative merit (e.g. fitness) of each welding sequence. Welding sequence generator 110 may output welding sequences with the highest relative merit as potential welding sequences to be performed on an assembly, so that a user, such as an operator or engineer, may be informed of the results.

Welding sequence generator 110 may also identify candidates from a previous population to be used to generate a subsequent population such that at least one welding sequence in the subsequent population has an objective function (discussed in greater detail below) with a relative merit that is greater than or equal to the merit values of all of the welding sequences in the previous population. For example, if the objective function represents distortion, welding sequence generator 110 may identify candidates from a previous population such that at least one welding sequence in the subsequent population has a distortion less than or equal to the distortion in all of the welding sequences in the previous population. In one embodiment, welding sequence generator 110 may identify candidates from the previous population as the welding sequences that, themselves, generated the least amount of distortion. These candidates may then be used to along with crossover and/or mutation operations to generate the subsequent population.

Controller 120 may include any device capable of receiving welding sequences from welding sequence generator 110, generating input files for one or more welding sequences, and sending the input files to welding simulators 140, 142, and/or 144 for processing. In certain embodiments, controller 120 may be embodied by a computer or other device that may include a processor, a memory, and a storage (not shown). The memory may include one or more programs loaded from the storage or elsewhere that, when executed by the processor, enable controller 120 to perform various procedures, operations, or processes consistent with disclosed embodiments, including the processes described with regard to FIG. 3. The storage may store information and data that may be used by controller 120 to generate input files and send the input files to welding simulators 140, 142, and/or 144. For example, welding simulators 140, 142, and 144 may implement Virtual Fabrication Technology (VFT™) provided by Caterpillar and Battelle Memorial Institute of Engineering Mechanics Corporation. In such embodiments, controller 120 may store one or more Abaqus™ input decks in storage, enabling controller 120 to generate the input files from the input decks. Further, the storage may store workload balancing software that enables controller 120 to send input files to welding simulators 140, 142, and 144 in a way that balances workloads among them and allows them to process different input files in parallel.

In some embodiments, controller 120 and welding sequence generator 110 may be implemented as a single device, e.g., a computer running software that enables the computer to perform one or more of the functions related to different embodiments of welding sequence generator 110 and controller 120, as discussed above. In other embodiments, controller 120 may be included in one of the welding simulators 140, 142, or 144, e.g., causing one of welding simulators 140, 142, and 144 to act as a master and the remaining welding simulators 140, 142, and 144 to act as a slave.

Welding simulators 140, 142, and 144 may include any device capable of simulating welding of an assembly for one or more welding sequences. In some embodiments, welding simulators 140, 142, and/or 144 may implement one or more simulation techniques to calculate different effects that welding sequences may have on an assembly, e.g., mechanical distortion, welding time, rollover requirements, etc. As discussed above, in certain embodiments, welding simulators 140, 142, and 144 may implement VFT™. In such embodiments, Controller 120 may store one or more Abaqus™ input decks in storage, enabling controller 120 may use to generate the input files from the input decks. However, the type of welding simulator used is not critical and welding simulator known to one of skill in the art may be used, as long as the welding simulator is capable of rendering effects of welding sequences such that differences among the effects of each welding sequence within a population may be determined.

In certain embodiments, welding simulators 140, 142, and 144 each may be embodied by a computer or other device that may include a processor, a memory, and a storage (not shown). In other embodiments, welding simulators 140, 142, and 144 may be embodied by a single computer with multiple processors. The memory may include one or more programs loaded from the storage or elsewhere that, when executed by the processor, enable welding simulators 140, 142, and 144 to perform various procedures, operations, or processes consistent with disclosed embodiments, including the processes described with regard to FIG. 3. The storage may store information and data that may be used simulate welding operations based on the input files received from controller 120. While only three welding simulators are shown in FIG. 1, any number of welding simulators may be used.

In some embodiments, welding simulators 140, 142, and 144 may be configured to process welding simulations in parallel. For example, welding simulator 140 may receive an input file for a first welding sequence, welding simulator 142 may receive an input file for a second welding sequence, etc., and each welding simulator may process the welding simulation independently of any other welding simulator. Further, welding simulators 140, 142, and 144 each may also be configured to process a particular welding simulation in parallel, e.g., using multiple processors.

Once a welding simulation is complete, welding simulators 140, 142, and/or 144 may send the results of the welding simulation to controller 120 and/or welding sequence generator 110. The results may include, e.g., an amount of mechanical distortion at one or more locations on the assembly, total welding time, number of rollovers, etc. In some embodiments, the results may correspond to the user-generated objective function. For example, if the objective function includes a weighted sum of the mechanical distortion at one or more locations on the assembly, then the results may include the mechanical distortion at one or more locations on the assembly.

Network 130 may include any one of or combination of wired or wireless networks. For example, network 130 may include wired networks such as twisted pair wire, coaxial cable, optical fiber, and/or a digital network. Likewise, network 130 may include any wireless networks such as RFID, microwave or cellular networks or wireless networks employing, e.g., IEEE 802.11 or Bluetooth protocols. Additionally, network 130 may be integrated into any local area network, wide area network, campus area network, or the Internet.

Figure 2:
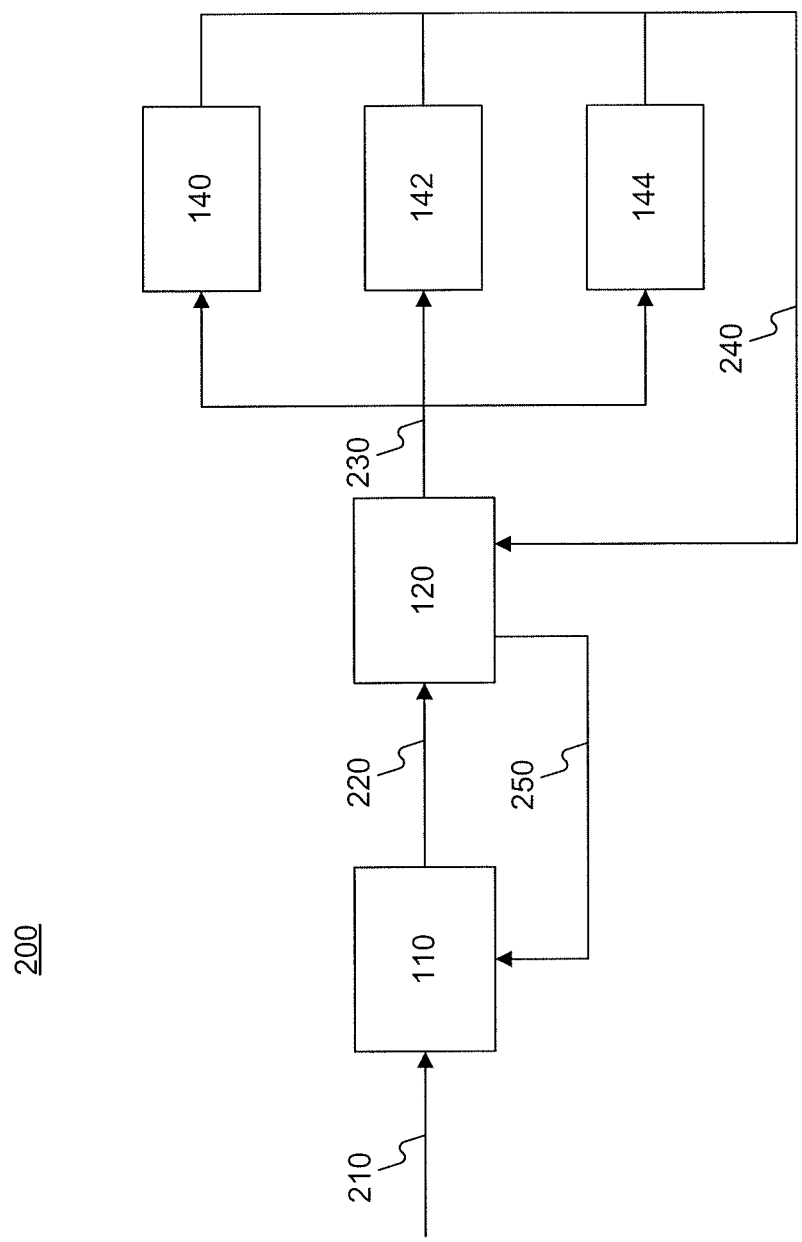
FIG. 2 is a diagrammatic illustration of an exemplary data flow diagram that may describe the flow of data through the system of FIG. 1.

FIG. 2 shows an exemplary data flow diagram 200 that describes an exemplary flow of data through system 100. In one embodiment, welding sequence generator 110 may receive one or more user-generated constraints, or other inputs, as discussed above (data flow 210). Welding sequence generator 110 may apply the user-generated constraints and/or other inputs to generate the initial population and/or the subsequent populations of the genetic algorithm.

Welding sequence generator 110 may send the first population of welding sequences to controller 120 (data flow 220). If welding sequence generator 110 and controller 120 are embodied by a single device, data flow 220 may occur internally to the single device. The weld sequences may be sent to controller 120 as a series of numbered welding sequences, or in any other format consistent with disclosed embodiments.

Controller 120 may receive the initial population of welding sequences and generate input files that enable welding simulators 140, 142, and 144 to simulate welding for each of the welding sequences in the initial population. In an embodiment where welding simulators 140, 142, and 144 implement VFT™ or a similar simulation program, controller 120 may store an Abaqus analysis input file for each welding sequence. Controller 120 may generate an input file for a particular welding sequence by ordering the Abaqus steps in the Abaqus input file corresponding to each welding step according to the welding sequence.

Controller 120 may send the input files to one or more of welding simulators 140, 142, and 144 (data flow 230). In one embodiment, controller 120 may simultaneously send all of the input files for the welding sequences in the population to welding simulators 140, 142, and 144. In another embodiment, controller 120 may monitor the progress of welding simulators 140, 142, and 144 and may implement a workload balancing algorithm to balance the workload among welding simulators 140, 142, and 144.

Welding simulators 140, 142, and 144 may perform welding simulations for each of the input files received. In an embodiment where controller 120 sends all of the input files, welding simulator 140 may implement a workload balancing algorithm to balance the workload among welding simulators 140, 142, and 144. In an embodiment where controller 120 balances the workload, each welding simulator 140, 142, and 144 may perform a welding simulation for the input file it receives and notify controller 120 once the welding simulation is complete (data flow 240). Upon receiving notification, controller 120 may send another input file to the welding simulator that completed the simulation.

As welding simulators 140, 142, and 144 complete simulations, they may send data regarding results of the simulations to controller 120 (data flow 240). This data may include, e.g., data related to the effects of a particular welding sequence, such as amounts of mechanical distortion at one or more points of the assembly, total welding time required, number of rollovers required, etc. Controller 120 may gather this data and feed back all or part of the data to welding sequence generator 110 (data flow 250).

Welding sequence generator 110 may use data from controller 120 to determine a relative merit (e.g. fitness) of each welding sequence with regard to the objective function. As discussed above, welding sequence generator 110 may generate an objective function for the genetic algorithm based on user-generated inputs. For example, if a goal is to minimize the distortion at the end of an assembly in a plane perpendicular to an axis of the assembly, then the objective function may be determined to be a sum of the distortion measured at the tip of the assembly and at two other points in the plane perpendicular to the axis of the assembly. Thus, the objective function may be represented as:

$$F=|U_1|+|U_2|+|U_3|, \qquad (1)$$

where $U_1$ is the distortion value at the tip of the assembly and $U_2$ and $U_3$ are the distortion values at the two other points in the plane. Of course, any other objective functions may be used. In one embodiment, welding sequence generator 110 may determine a merit value of each welding sequence by using the data from welding simulators 140, 142, and/or 144 as input to the variables of the objective function. For example, equation (1) may be the objective function, and welding simulators 140, 142, and/or 144 may have determined, among other things, the estimated distortion values, $U_1$, $U_2$, and $U_3$ for one or more welding sequences. Thus, if a first welding sequence includes values of 4 cm, 6 cm, and 8.5 cm for $U_1$, $U_2$, and $U_3$, respectively, welding sequence generator 110 may calculate a merit value of 18.5 for the first welding sequence. The merit values of other welding sequences may be calculated in a similar manner.

Once the merit values for each welding sequence have been determined, welding sequence generator 110 may compare the merit values to one or more predetermined criteria. For example, welding sequence generator 110 may store a threshold value corresponding to the objective function, e.g., the weighted sum of the mechanical distortion at the three points must be less than a user-generated value and/or the number of rollovers must be less than two. Similarly, welding sequence generator 110 may compare a statistical analysis of the merit values of a current population of welding sequences to the same statistical analysis of the merit values of a previous population of welding sequences. The statistical analysis may include, e.g., average merit values across all or a subset of merit values, such as a predetermined number of highest or lowest merit values; a weighted sum of all or a subset of merit values; a maximum or minimum merit value; or any other statistic of the population of welding sequences. In some embodiments, if the merit values of the current population do not improve by more than a predetermined improvement threshold over the merit functions of the previous population, welding sequence generator 110 may determine that a predetermined criterion is met, because it may determine that a local minimum has been attained.

If one or more weld sequences meet the predetermined criteria, then welding sequence generator 110 may output those welding sequences via, e.g., a display device, to a user as potential welding sequences. If, on the other hand, one or more sequences do not meet the predetermined criteria, welding sequence generator 110 may generate a subsequent population of welding sequences. As discussed above, welding sequence generator 110 may receive a user-generated maximum of populations that can be produced. Thus, if welding sequence generator 110 determines that another population can be produced without violating the maximum number of populations, welding sequence generator 110 may generate a subsequent population of welding sequences, which may then be processed through system 100 as explained above with regard to data flow diagram 200.

As discussed above, in welding sequence generator 110 generate a subsequent population of welding sequences based on mutation and/or crossover operations performed on candidate sequences chosen from a previous population. In certain embodiments, the candidates may be chosen such that at least one welding sequence in the subsequent population has an objective function with a merit value that is greater than or equal to the merit values of all of the welding sequences in the previous population. In one embodiment, welding sequence generator 110 may identify candidates from the previous population as the welding sequences that, themselves, had the highest merit values.

When outputting one or more potential welding sequences to a user, welding sequence generator 110 may output a predetermined number of welding sequences in the population. In some embodiments, the predetermined number may be adjustable by, e.g., a user of welding sequence generator 110. Further, welding sequence generator 110 may display additional information regarding each of the potential welding sequences. For example, welding sequence generator 110 may display each potential welding sequence along with the corresponding merit value, other values corresponding to distortion amounts, total weld time, number of rollovers, other effects, etc. Welding sequence generator 110 may also indicate, from among the potential welding sequences, the particular welding sequences that may be of particular interest, e.g., the welding sequence with the minimum distortion, minimum total weld time, minimum number of rollovers, etc. In some embodiments, these additional indications may be customizable by a user, for example.

Several embodiments discussed above are described as being stored in a memory on a computer. However one of skill in the art will appreciate that these aspects can also be stored on other types of tangible computer-readable media, such as secondary storage devices, like hard disks, floppy disks, a CD-ROM, or other forms of RAM or ROM or any type of computer-readable storage device.

INDUSTRIAL APPLICABILITY

The disclosed system 100 may be applicable to determining an optimal or acceptable welding sequence for any assembly to be welded. For example, the assembly to be welded may be a component of any system or machine, including, e.g., mining, construction, loading, and/or hauling machines and sub-systems thereof. The disclosed system 100 may reduce the required computing resources and allow for faster determination of the optimal and/or acceptable welding sequence for an assembly. The operation of system 100 will now be explained in connection with the flowchart of FIG. 3.

System 100 may receive one or more constraints for the genetic algorithm (step 310), e.g., a user-generated constraint, such as a subsequence constraint, a contiguous constraint, a rollover constraint, or any other type of constraint. System 100 may create an initial population of weld sequences based on the received constraint (step 320). For example, system 100 may generate welding sequences such that all of the welding sequences in the initial population satisfy the received user-generated constraints. In one embodiment, system 100 may first generate welding sequences as an initial population without regard to the constraints received in step 310. In this embodiment, system 100 may then eliminate welding sequences from the initial population based on the constraint after the sequences are generated.

System 100 may then simulate welding for each of the welding sequences in the population (step 340). For example, system 100 may determine various effects of each of the welding sequences on the assembly to be welded, e.g., mechanical distortion, welding time, rollover requirements, etc. In some embodiments, system 100 may simulate welding for two or more welding sequences in parallel.

System 100 may calculate merit values for each of the welding sequences based on data from the welding simulation and an objective function used in the genetic algorithm (step 350). System 100 may compare the merit values of the welding sequences to one or more predetermined criteria (step 360). For example, system 100 may determine if the merit value is within a predetermined threshold or if a statistical analysis of the merit values (e.g., average merit values, weighted sum of the merit values, maximum or minimum merit values, etc.) for the current population are within a predetermined difference threshold of the same statistical analysis of the merit values for the previous population. System 100 may also determine whether a maximum number of populations have been generated (step 360). If neither the predetermined criteria nor the maximum number of populations have been met (step 360, No), then system 100 may generate a subsequent population of welding sequences (step 320). The process may then repeat until a predetermined criteria is met or a maximum number of populations is generated (step 360, Yes).

If, on the other hand, the predetermined criteria have been met or a maximum number of populations have been generated, system 100 may output one or more welding sequences from the current population (step 370). For example, if one or more welding sequences have merit values below a predetermined threshold, system 100 may output those welding sequences to a user, e.g., via a display device, presenting the welding sequences as potential welding sequences for the assembly. Further, if a maximum number of populations have been generated or if the current population of welding sequences have merit values within a predetermined difference value of the previous population of welding sequences, then system 100 may output a predetermined number of welding sequences with the lowest or highest merit value (e.g., lowest mechanical distortion, etc.), as the potential welding sequences. The number of welding sequences to be output may be controlled by the user.

It will be apparent to those skilled in the art that various modifications and variations can be made to the disclosed welding sequence determination system. Other embodiments will be apparent to those skilled in the art from consideration of the specification and practice of the disclosed welding sequence determination system. It is intended that the specification and examples be considered as exemplary only, with a true scope being indicated by the following claims and their equivalents.

What is claimed is:

1. A system for determining a welding sequence including a plurality of welding operations, the system comprising:
    a welding sequence generator configured to create an initial population of welding sequences based on at least one user-generated constraint; and
    a welding simulator configured to simulate welding for each one of the welding sequences in the initial population to model distortion for the welding sequence, wherein
    the welding sequence generator is further configured to:
        receive the distortion for each one of the welding sequences in the initial population from the welding simulator;
        determine whether a merit value derived from at least the distortion for at least one welding sequence satisfies one or more predetermined criteria;
        in response to a determination that there is no merit value that satisfies the one or more predetermined criteria, repeat the following steps until a merit value satisfies the one or more predetermined criteria:
            choose a subset of candidate welding sequences from a previous population of welding sequences based on the merit values of the welding sequences;
            create a subsequent population of welding sequences by performing mutation and crossover operations on the candidate welding sequences while imposing the user-generated constraint;
            simulate welding for each one of the welding sequences in the subsequent population of welding sequences to model distortion for the welding sequence; and
            determine whether a merit value derived from at least the distortion for at least one welding sequence in the subsequent population of welding sequences satisfies the one or more predetermined criteria; and
        output the at least one welding sequence corresponding to the merit value that satisfies the one or more predetermined criteria as a potential welding sequence.

2. The system of claim 1, wherein
    the at least one welding sequence in the subsequent population has a distortion less than or equal to the distortion in all of the welding sequences in the initial population.

3. The system of claim 1, the welding sequence generator being further configured to:
    receive a subsequence constraint restricting a relative order in which a subset of the plurality of welding operations must be performed as the at least one user-generated constraint; and
    create the initial population of welding sequences such that the limited population only includes welding sequences that comply with the subsequence constraint.

4. The system of claim 1, the welding sequence generator being further configured to:
    receive a rollover constraint restricting a number of times a assembly to be welded may be rolled over; and
    create the initial population of welding sequences such that the limited population only includes welding sequences that comply with the rollover constraint.

5. The system of claim 1, wherein the welding sequence generator implements a genetic algorithm to generate the population of welding sequences.

6. The system of claim 1, the welding sequence generator being further configured to:
    create subsequent populations of welding sequences until a maximum number of repopulations has been performed or the merit value for at least one welding sequence in the subsequent populations of welding sequences satisfies the one or more predetermined criteria.

7. The system of claim 5, the welding sequence generator being further configured to:
    perform a comparison of an objective function value of the genetic algorithm to the merit value;
    determine whether the merit value satisfies one or more predetermined criteria based on the comparison; and
    regenerate a subsequent population of welding sequences if the merit value does not satisfy the predetermined criteria.

* * * * *